United States Patent
Petti

(10) Patent No.: US 12,073,886 B2
(45) Date of Patent: Aug. 27, 2024

(54) SEMICONDUCTOR MEMORY DEVICE WITH WRITE DISTURB REDUCTION

(71) Applicant: SUNRISE MEMORY CORPORATION, San Jose, CA (US)

(72) Inventor: Christopher J. Petti, Mountain View, CA (US)

(73) Assignee: SUNRISE MEMORY CORPORATION, San Jose, CA (US)

(*) Notice: Subject to any disclaimer, the term of this patent is extended or adjusted under 35 U.S.C. 154(b) by 231 days.

(21) Appl. No.: 17/685,133

(22) Filed: Mar. 2, 2022

(65) Prior Publication Data

US 2022/0293188 A1    Sep. 15, 2022

Related U.S. Application Data

(60) Provisional application No. 63/159,260, filed on Mar. 10, 2021.

(51) Int. Cl.
| | |
|---|---|
| *G11C 7/00* | (2006.01) |
| *G11C 16/08* | (2006.01) |
| *G11C 16/10* | (2006.01) |
| *G11C 16/24* | (2006.01) |
| *G11C 16/26* | (2006.01) |

(52) U.S. Cl.
CPC .......... *G11C 16/102* (2013.01); *G11C 16/08* (2013.01); *G11C 16/24* (2013.01); *G11C 16/26* (2013.01)

(58) Field of Classification Search
CPC ....... G11C 7/1078; G11C 7/22; G11C 7/1006; G11C 7/1072; G11C 7/1096
USPC ........................ 365/189.16, 189.14
See application file for complete search history.

(56) References Cited

U.S. PATENT DOCUMENTS

| | | | |
|---|---|---|---|
| 5,646,890 | A | 7/1997 | Lee et al. |
| 6,128,224 | A | 10/2000 | Morton et al. |
| 7,170,788 | B1 | 1/2007 | Wan et al. |
| 7,355,889 | B2 | 4/2008 | Hemink et al. |
| 7,450,430 | B2 | 11/2008 | Hemink et al. |
| 8,565,018 | B2 | 10/2013 | Goda et al. |
| 9,437,322 | B2 | 9/2016 | Smith |
| 9,859,013 | B2 * | 1/2018 | Lasser .............. G11C 16/3418 |

(Continued)

FOREIGN PATENT DOCUMENTS

WO    2007078793 A1    7/2007

OTHER PUBLICATIONS

"PCT Search Report and Written Opinion, PCT/US2022/18541", Jun. 21, 2022, 16 pages.

*Primary Examiner* — Son T Dinh

(57) ABSTRACT

A semiconductor memory device implements a write disturb reduction method to reduce write disturb on unselected memory cells by alternating the order of the write logical "1" step and write logical "0" step in the write operations of selected memory cells associated with the same group of bit lines. In one embodiment, a method in an array of memory cells includes performing write operation on the memory cells in one of the memory pages to store write data into the memory cells where the write operation includes a first write step of writing a data of a first logical state and a second write step of writing data of a second logical state; and performing the write operation for each row of memory cells by alternately performing the first write step followed by the second write step and performing the second write step followed by the first write step.

24 Claims, 9 Drawing Sheets

(56) References Cited

U.S. PATENT DOCUMENTS

| | | |
|---|---|---|
| 10,121,553 B2 | 11/2018 | Harari et al. |
| 2009/0067244 A1 | 3/2009 | Li et al. |
| 2013/0286747 A1 | 10/2013 | Kwak |
| 2020/0327943 A1 | 10/2020 | Maejima |
| 2021/0183459 A1 | 6/2021 | Tang et al. |
| 2021/0272636 A1 | 9/2021 | Papagianni et al. |

* cited by examiner

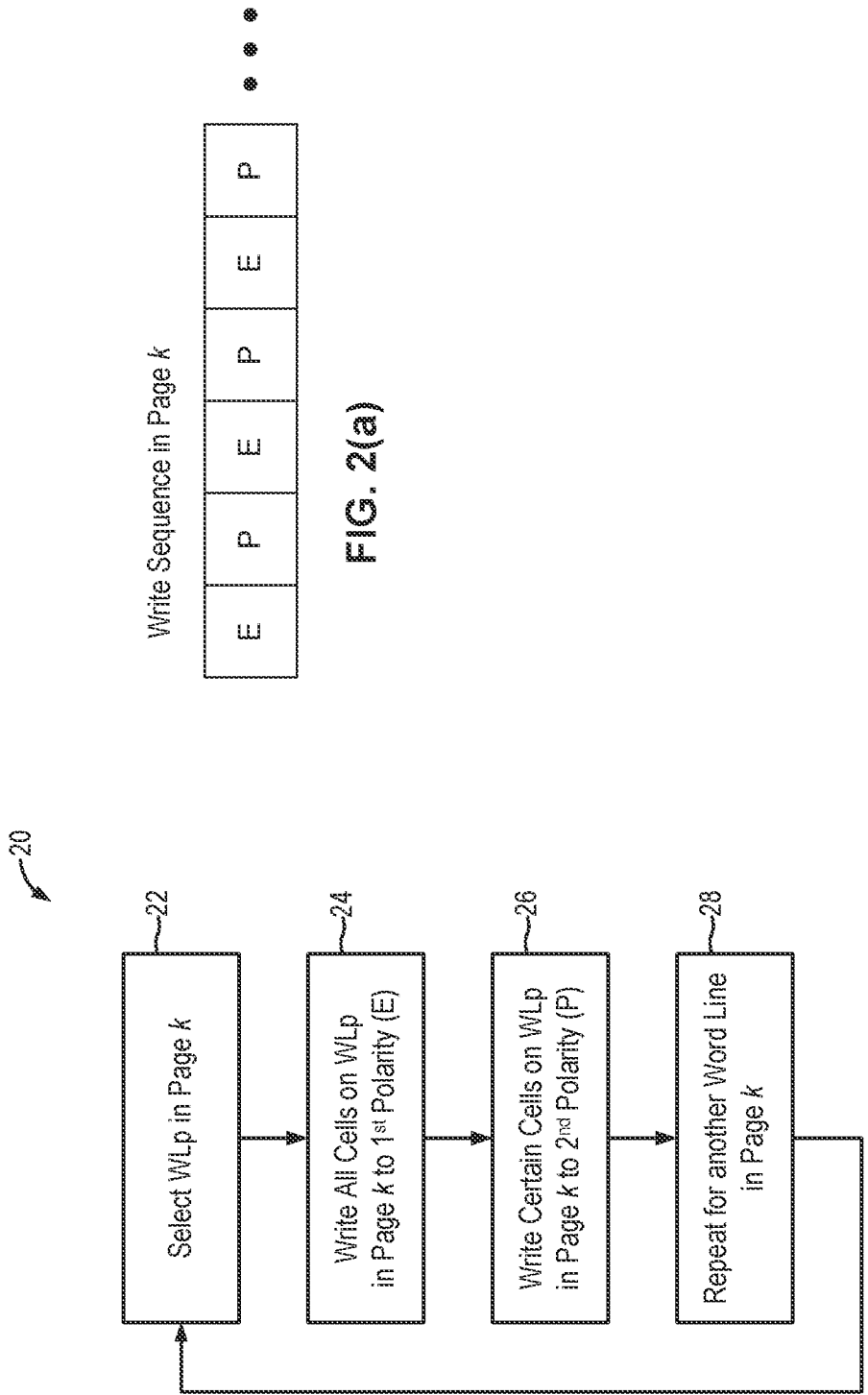

SEMICONDUCTOR MEMORY DEVICE WITH WRITE DISTURB REDUCTION

CROSS REFERENCE TO RELATED APPLICATIONS

This application claims priority to U.S. Provisional Patent Application No. 63/159,260, entitled SEMICONDUCTOR MEMORY DEVICE WITH WRITE DISTURB REDUCTION, filed Mar. 10, 2021, which is incorporated herein by reference for all purposes.

FIELD OF THE INVENTION

The present invention relates to semiconductor memory circuits and methods. More specifically, the present invention relates to semiconductor memory circuits and methods reducing impact of write disturb to unselected memory cells during write operations to selected memory cells.

BACKGROUND OF THE INVENTION

U.S. Pat. No. 10,121,553 (the '553 patent), entitled "Capacitive-Coupled Non-Volatile Thin-film Transistor NOR Strings in Three-Dimensional Arrays," filed on Aug. 26, 2016, and issued on Nov. 6, 2018, discloses storage or memory transistors organized as 3-dimensional arrays of NOR memory strings formed above a planar surface of a semiconductor substrate. In the '553 patent, a NOR memory string includes numerous thin-film storage transistors that share a common bit line and a common source line. In one implementation, storage transistors in a NOR memory string are arranged along a direction (a "horizontal direction") that is substantially parallel to the planar surface of the semiconductor substrate. In such a 3-dimensional array, the NOR memory strings are provided on multiple planes (e.g., 8 or 16 planes) above the semiconductor substrate, with the NOR memory strings on each plane arranged in rows and one or more columns along two orthogonal horizontal directions. Data is stored in a charge storage film (e.g., a silicon oxide-silicon nitride-silicon oxide triple layer) in each storage transistor. The '553 patent is hereby incorporated by reference in its entirety for all purposes.

In the '553 patent, each storage transistor of a NOR memory string is read, programmed or erased by suitably biasing its associated word line and the common bit line it shares with other storage transistors in the NOR memory string. The storage transistor's associated word line is shared with storage transistors of NOR memory strings on other planes that are aligned with the storage transistor along the direction normal to the planar surface of the semiconductor substrate ("vertical direction"). Each word line may also be shared between two storage transistors from nearby NOR memory strings on the same plane. During read, programming or erase operations, the common source line of the NOR memory string is typically provided a relatively constant voltage that is maintained either by a voltage source or by the charge in an associated capacitor ("virtual ground"), such as the parasitic capacitance of the common source line. To program or erase the storage transistor, for example, a substantial voltage difference (e.g., 8 volts) is imposed across the common bit line and the word line. However, due to the high-density of storage transistors in the memory array, the states of nearby storage transistors (e.g., storage transistors associated with same word line or in the same NOR memory string) are vulnerable to interference or disturb by the changes in the bias voltages (e.g., by capacitive coupling). To mitigate disturb to a non-selected storage transistor, a predetermine voltage difference that is significantly less than the required voltage to program or erase may be imposed across a storage transistor's associated word line and its common bit line, so as to inhibit undesired programming or erasing of the unselected storage transistor.

SUMMARY OF THE INVENTION

In some embodiments, a method for reducing write disturb in an array of memory cells arranged in memory pages where each memory page includes memory cells arranged in rows and columns includes selecting a row of memory cells in a first memory page for a write operation to store write data into the memory cells; determining a step order value indicative of a write step order of the write operation; in response to the step order value having a first logical state, performing the write operation by writing data of a first logical state in all the memory cells in the selected row followed by writing data of a second logical state in at least a subset of memory cells in the selected row in response to the write data; and in response to the step order value having a second logical state, performing the write operation by writing data of the second logical state in all the memory cells in the selected row followed by writing data of the first logical state in at least a subset of memory cells in the selected row in response to the write data.

In other embodiments, a method for reducing write disturb in an array of memory cells arranged in memory pages where each memory page includes memory cells arranged in rows and columns includes performing write operation on the memory cells in one of the memory pages to store write data into the memory cells where the write operation includes a first write step of writing a data of a first logical state and a second write step of writing data of a second logical state; and for write operation to be performed on memory cells in a selected memory page, performing the write operation for each row of memory cells by alternately performing the first write step followed by the second write step and performing the second write step followed by the first write step.

In other embodiments, a memory device includes an array of memory cells arranged in memory pages where each memory page includes memory cells arranged in rows and columns; and a control circuit configured to control write operations of the memory cells. In operation, the control circuit selects a row of memory cells in a first memory page for a write operation to store write data into the memory cells where the control circuit performs the write operation by: determining a step order value indicative of a write step order of the write operation; in response to the step order value having a first logical state, performing the write operation by writing data of a first logical state in all the memory cells in the selected row followed by writing data of a second logical state in at least a subset of memory cells in the selected row in response to the write data; and in response to the step order value having a second logical state, performing the write operation by writing data of the second logical state in all the memory cells in the selected row followed by writing data of the first logical state in at least a subset of memory cells in the selected row in response to the write data.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

FIG. 2, which includes FIG. 2(a), illustrates conventional write operations in a semiconductor memory array in some examples.

DETAILED DESCRIPTION OF THE INVENTION

Figure 1:
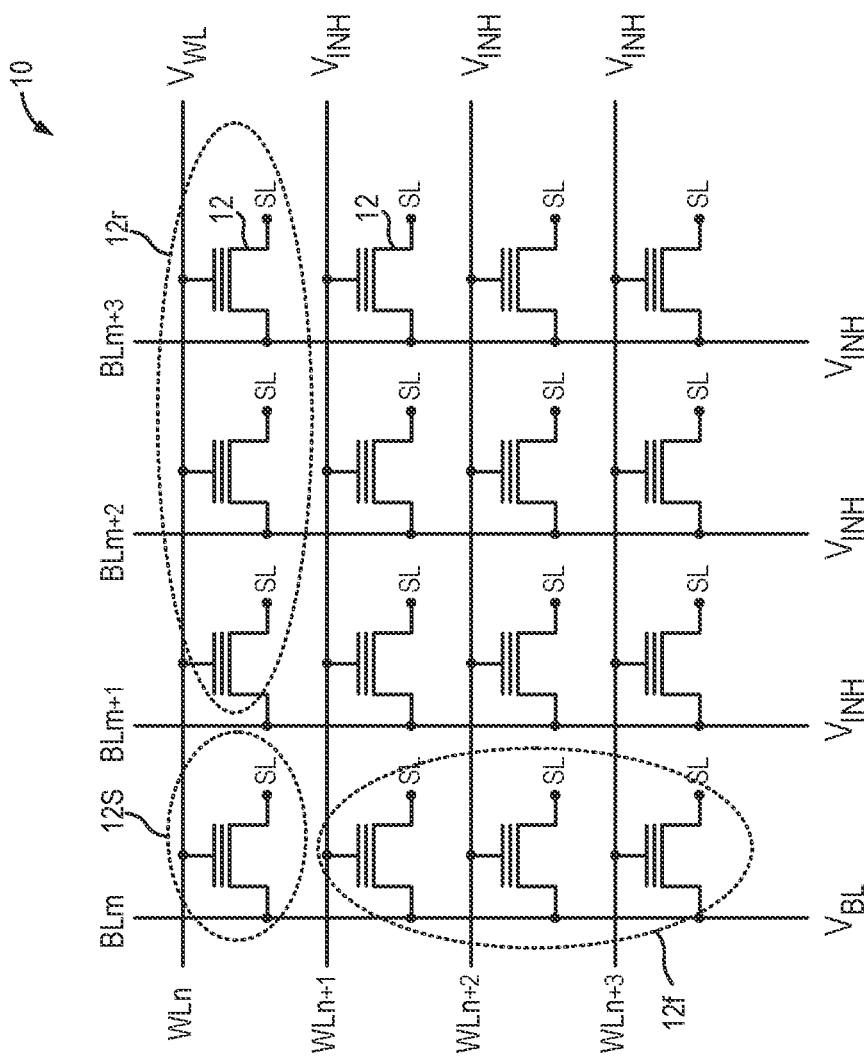
FIG. 1 is a schematic diagram of a portion of a semiconductor memory array in examples of the present disclosure.

In embodiments of the present disclosure, a semiconductor memory device implements a write disturb reduction method to reduce the impact of write disturb on unselected memory cells by alternating the order of the write logical "1" step and write logical "0" step of write operations of selected memory cells associated with the same group of bit lines.

The write disturb reduction method of the present disclosure is applicable for non-volatile memory devices, such as a flash memory, or to quasi-volatile memory devices, such as the three-dimensional arrays of NOR memory strings described in the '553 patent. More specifically, the write disturb reduction method of the present disclosure applies to non-volatile or quasi-volatile memory devices that allow direct-write of data to the memory cells, that is, not requiring a block erase operation such as that required in a NAND flash. In particular, the write disturb reduction method of the present disclosure applies to memory architectures that use two distinct operations or steps to perform the direct write of data into the memory cells: an erase operation and a program operation. In some examples, the memory devices in which the write disturb reduction method of the present disclosure can be implemented include charge-storage-based or charge-trapping type NOR memory cells, ferroelectric type NOR memory cells, or certain implementations of 2-terminal-based memory cells with separate selector elements, such as resistive memories (ReRAM) or magnetic RAM (MRAM). In embodiments of the present disclosure, the write disturb reduction method is implemented in a semiconductor memory device constructed using three-dimensional arrays of NOR memory strings formed over a semiconductor substrate, as described in the aforementioned '553 patent. In the present description, a NOR-type memory string includes storage transistors formed above a planar surface of a semiconductor substrate that share a common source region and a common drain region, where each storage transistor can be individually addressed and accessed. In some examples, a three-dimensional array can be formed with the NOR memory strings provided on multiple planes (e.g., 8 or 16 planes) above the semiconductor substrate, with the NOR memory strings on each plane arranged in rows. In the present description, the semiconductor memory device is sometimes referred to as a "quasi-volatile memory" ("QV memory").

In the present description, the semiconductor memory device includes memory cells (or storage transistors) which can be read, programmed or erased. A write operation into the memory device includes two operations or steps—the erase step or erase operation and the program step or program operation. In the present embodiment, the erase step is associated with writing a logical "1" into a memory cell and the program step is associated with writing a logical "0" into the memory cell. It is instructive to note that the specific logical state assigned to the erase or program operation is arbitrary and not critical to the practice of the present disclosure. In other embodiments, the erase step can be associated with writing a logical "0" into a memory cell and the program step is associated with writing a logical "1" into the memory cell.

In the embodiments of the present disclosure, the semiconductor memory device is formed using thin-film storage transistors implementing charge trapping as the data storage mechanism where data is stored in a charge storage film in each storage transistor. For examples, the charge storage film includes a tunneling dielectric layer, a charge trapping layer and a blocking layer, which can be implemented as a multilayer including silicon oxide, silicon nitride, and silicon oxide, arranged in this order and referred to as an ONO layer. An applied electrical field across the charge storage film adds or removes charge from charge traps in the charge trapping layer of the charge storage film, altering the threshold voltage of the storage transistor to encode a given logical state to the storage transistor.

In other embodiments, the semiconductor memory device may be formed using ferroelectric field-effect transistors as the storage transistors. More specifically, a ferroelectric field-effect transistor (referred herein as ferroelectric transistors or FeFETs) is formed by using a ferroelectric material as the gate dielectric layer between the gate conductor and the channel of a field-effect transistor. The ferroelectric transistor realizes memory function by storing data as polarization states in the ferroelectric gate dielectric layer. In particular, a voltage applied to the gate conductor induces electrical polarization in the ferroelectric gate dielectric layer, which polarization can be reversed with application of a voltage in the opposite polarity. The induced polarization states of the ferroelectric dielectric layer change the threshold voltage of the ferroelectric transistor. The change or shift in the threshold voltage of the ferroelectric transistor due to the different polarization states can be used to represent data in different logical states. For example, two logical states (e.g., "0" and "1") can be represented by the higher and lower threshold voltages of the ferroelectric transistor as a result of two induced electrical polarization states in the ferroelectric dielectric layer.

In some embodiments, a ferroelectric storage transistor is constructed in a similar manner as the charge-trapping storage transistors by replacing the charge storage film with a gate dielectric layer incorporating a ferroelectric material. In some embodiments, the ferroelectric gate dielectric layer is a doped hafnium oxide ($HfO_2$) layer. In one example, the hafnium oxide is doped with zirconium oxide ($ZrO_2$) to form a hafnium zirconium oxide layer (HZO). In another example, the hafnium oxide is doped with silicon (Si), iridium (Ir) and lanthanum (La). In some embodiments, the gate dielectric layer may further include an interfacial layer, such as a material with a high permittivity, between the channel region and the ferroelectric gate dielectric layer. In the case of a ferroelectric storage transistor, the gate conductor is formed as a metal layer, such as a titanium nitride (TiN) layer, in some embodiments.

FIG. 1 is a schematic diagram of a portion of a semiconductor memory array in examples of the present disclosure. FIG. 1 illustrates memory cells arranged in a two-dimensional array. It is understood that the semiconductor memory array may be formed in a two-dimensional or a three-dimensional array of memory cells and FIG. 1 merely illustrates a portion of any two-dimensional or three-dimensional memory array.

Referring to FIG. 1, a memory array 10 includes memory cells or storage transistors 12 arranged in rows and columns. Memory cells 12 can be non-volatile or quasi-volatile storage transistors. Memory cells 12 in a row are accessed by the same word line (WLn, WLn+1, WLn+2, WLn+3, and so on). Memory cells 12 in a column are associated with the same bit line (BLm, BLm+1, BLm+2, BLm+3, and so on). Each memory cell 12 has a control gate connected to the word line WL and a drain terminal connected to the bit line. Each memory cell 12 may also have a source terminal connected to a source line SL, which may be a common line for all the memory cells in the array 10. Memory cells 12 along a bit line are sometimes referred to as a memory string. In one example, there may be thousands of word lines (e.g. 4096 word lines), resulting in thousands of memory cells in a memory string. The memory array 10 includes a control circuit (not shown) for controlling the operation of the memory array.

In the present description, the memory array 10 includes memory cells that implement charge trapping as the data storage mechanism. In other embodiments, the storage transistors can implement ferroelectricity as the data storage mechanism. The exact nature of the data storage mechanism being implemented in the memory array is not critical to the practice of the present invention. The biasing conditions applied to the storage transistors for read and write operations are a function of the data storage mechanism being implemented, as is understood by one skilled in the arts. The following description uses primarily the biasing conditions for charge trapping type storage transistors. It is understood that the biasing conditions for ferroelectric memory cells are opposite in voltage polarities to that of the charge trapping type memory cells, as will be explained in more details below.

In some examples, the memory array may be organized in memory pages where a memory page refers to a group of memory cells that are accessed together for read and write operations. In the present description, a memory page include memory cells that share a given word line and are associated with a group of bit lines. In this configuration, each row of memory cells along the group of bit lines forms a memory page. Each row of memory cells in the memory page are accessed together by the respective common word line. In actual implementation, a memory page may be formed by memory cells from bit lines that are not necessarily adjacent to each other. For instance, the memory array 10 may be divided into banks or blocks or slices and a memory page may be formed by assigning a bit line from each bank/block/slice to a memory page. For instance, the bit lines of a memory page may be associated with individual sense amplifiers to enable simultaneous read operation from the memory cells in the memory page. In the following description, the memory array is sometimes illustrated with a memory page being formed from a group of adjacent bit lines. It is understood that the illustration may be logical representation only and that in actual implementation, the memory page may be formed from bit lines that are located in separate memory banks, blocks or slices, or other distributed over the memory array.

To write data into a selected memory cell, such as memory cell 12S, in the memory array 10, a voltage pulse of a given amplitude $V_{WL}$ is applied to the selected word line, such as WLn, and a voltage pulse of another amplitude $V_{BL}$ is applied to one or more selected bit lines, such as the selected bit lines of a memory page. In FIG. 1, only one selected bit line BLm is shown. As described above, the write operation includes the erase step and the program step. The word line voltages and bit line voltages for the erase and program steps are different but are generically referred to as $V_{WL}$ and $V_{BL}$ in the present discussion. By way of explanation, for a charge-trapping type storage transistor, a positive word line voltage relative to the bit line voltage is applied to program the memory cell and a negative word line voltage relative to the bit line voltage is applied to erase the memory cell. For ferroelectric type storage transistors, the reverse voltage polarities are applied in the program or erase operation. That is, for a ferroelectric storage transistor, a negative word line voltage relative to the bit line voltage is applied to program the memory cell and a positive word line voltage relative to the bit line voltage is applied to erase the memory cell.

In memory array 10, word lines and bit lines connected to memory cells 12 that are not intended to be written—the unselected bit lines or word lines—are set at an inhibit voltage, $V_{INH\_WL}$ and $V_{INH\_BL}$, which are typically equal and are referred collectively as the inhibit voltage $V_{INH}$. In practice, the unselected memory cells sharing the same word line (e.g., memory cells 12r) or the same bit line (e.g. memory cells 12f) as the selected memory cell may become disturbed by the write operation. For example, memory cells 12f along the selected bit line BLm that are connected to unselected word lines would see a disturb voltage of $V_{INH}$-$V_{BL}$ for each write operation. Repeated write operations may move the state of these unselected memory cells in a given direction, until the state cannot be determined to be either a "1" or a "0". This movement may be gradual (as in a charge-storage or resistive-change memory cell) or abrupt (as in an MRAM cell, or any cell with a threshold selector element).

To mitigate the write disturb issue, refresh operations, which involve a periodic rewriting of stored data in the memory cells, have been used to ensure data integrity, as long as the susceptible data has not been disturbed to an indeterminate state. Alternately, algorithmic wear-leveling schemes have been used to re-write all stored data periodically.

The write disturb problem in the memory array is further explained with reference to FIG. 2. FIG. 2, which includes FIG. 2(a), illustrates conventional write operations in a semiconductor memory array in some examples. As described above, the memory array is typically accessed based on a group of memory cells, referred to as a memory page, where the group of memory cells are accessed simultaneously. For example, a page of memory data is read simultaneously from the memory page or a page of write data is written to the memory page simultaneously. The write operation of the memory cells is performed in two distinct steps: an erase step where memory data of a first polarity (or "first logical state") is written and a program step where memory data of a second, opposite polarity (or "second logical state") is written. In some cases, during the erase step, memory cells in the entire page may be written to the first logical state and then during the program step, only the memory cells that need to be flipped to the second logical state are programmed. As described above, the first polarity or first logical state may be a logical "1" and the second polarity or second logical state may be a logical "0", or vice versa.

In the present description, a group of bit lines that are organized to be accessed together is referred to as a page. The group of bit lines is usually associated with memory cells arranged in rows, each row being accessed by a respective word line. Each row of memory cells associated with the group of bit lines is referred to as a memory page. As described above, the bit lines in the group do not need to be located adjacent to each other in the memory array.

FIG. 2 illustrates a conventional write operation of memory cells in memory pages. Referring to FIG. 2, a write operation 20 to a memory page selects a word line WLp in a page k (22). The page k includes a group of bit lines to be accessed together. The memory page includes memory cells on word line WLp and associated with bit lines in page k. The write operation 20 then writes all the memory cells in the memory page on word line WLp to the first polarity (24). This can be referred to as an erase step. The write operation 20 then writes certain memory cells in the memory page on word line WLp to the second polarity based on the write data (26). This can be referred to as a program step. In the second step, all, some or none of the memory cells in the memory page may be written to the second polarity. The write operation 20 then repeats for another word line in the page k (28).

In the conventional write operation, the bit lines in page k experience a write sequence of erase and program steps alternately, as shown in FIG. 2(a). The repeated sequence of erase and program steps in a page of bit lines may exacerbate the write disturb problem. For example, a memory cell in page k but on a word line different from the written word line WLp may have stored memory data of the second logical state (e.g. logical "0"). The repeated sequence of erase steps on other memory cells in the same page (same group of bit lines) may cause the memory cell to slowly drift towards the first logical state (logical "1").

According to embodiments of the present disclosure, a semiconductor memory device implements a write disturb reduction method executing a modified write operation to reduce the impact of write disturb on memory cells associated with the same group of bit lines. In some embodiments, the modified write operation alternates the order of the erase and program steps in subsequent write operations on the same group or same page of bit lines. In other embodiments, the modified write operation randomly selects the order of the erase and program steps for each write operation on the same group or same page of bit lines. In this manner, memory cells on the same group of bit lines are not exposed to persistent writing of the same logical state ("1" or "0") which can result in the disturb of stored memory data of the opposite logical state.

In the present description, the write operation is described as including an erase step and a program step. It is instructive to note that the terms "erase" and "program" are used to designate writing data of a given logical state into a memory cell. For instance, "erase" refers to writing data of a first logical state into the memory cell and "program" refers to writing data of a second logical state into the memory cell. It is instructive to note that references to erase and program are merely for nomenclature purpose only. The write operation can be described as including a first step of writing a memory cell to a first logical state, referred herein as an "E" step, and a second step of writing a memory cell to a second logical state, referred herein as a "P" step. In the case of a write operation based on memory pages, the write operation may include a first step of writing all memory cells in a memory page to the first logical state and then a second step of writing some or none of the memory cells in the memory page to the second logical state. In one example, the first logical state may be logical "1" and the second logical state may be logical "0". In another example, the first logical state may be logical "0" and the second logical state may be logical "1".

In some embodiments, the modified write operation in the write disturb reduction method of the present disclosure alternates the order of the step of writing the first logical state and the step of writing the second logical state in subsequent write operations on the same group or same page of bit lines. In other embodiments, the modified write operation randomly selects the order of writing the first logical state and writing the second logical state for each write operation on the same group or same page of bit lines. In this manner, memory cells on the same group of bit lines are exposed to writing of different logical state ("1" or "0") so as to reduce the amount of write disturb on memory cells on the same group of bit lines.

Figures 3, 3A, 3B:
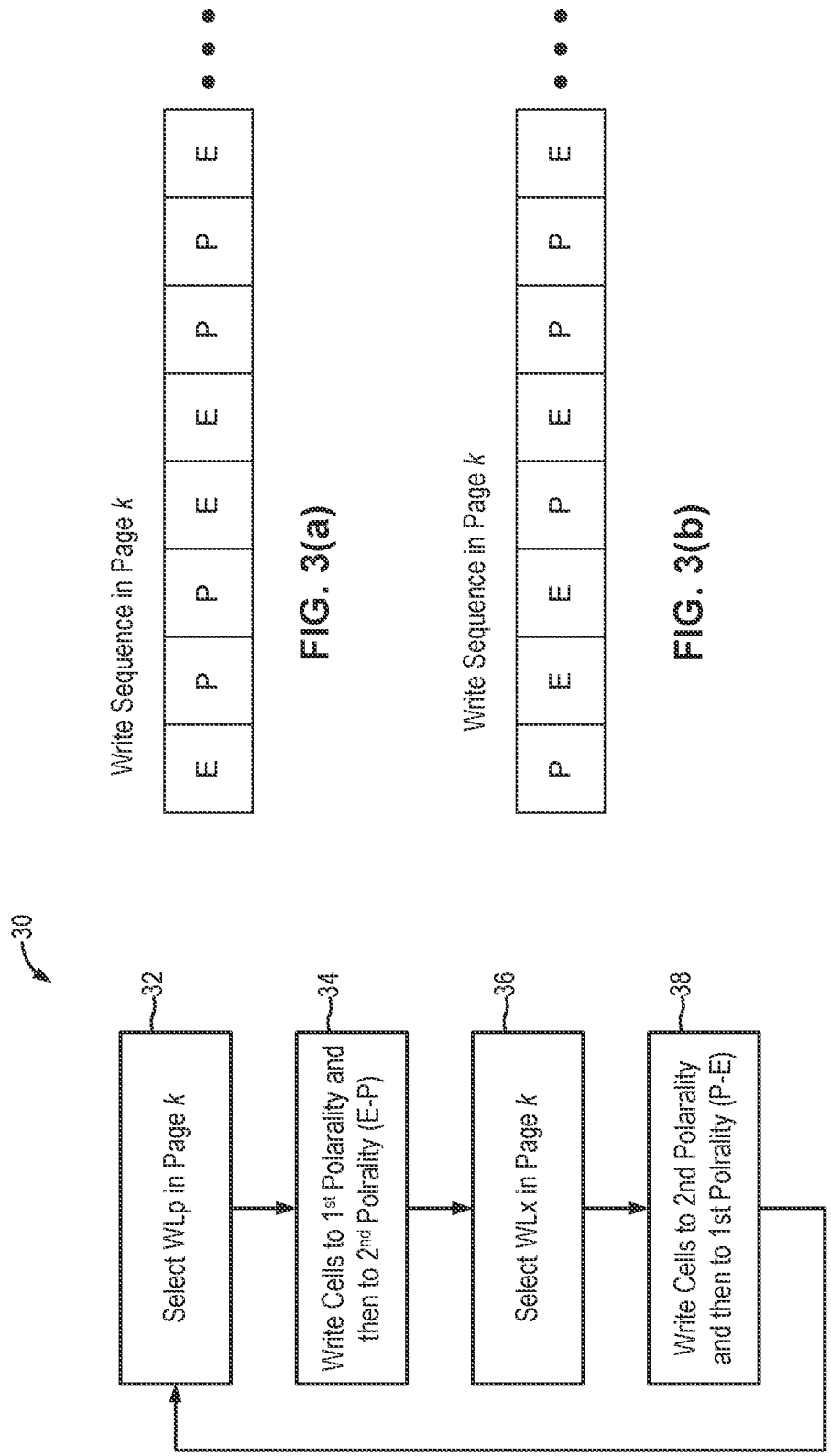
FIG. 3, which includes
FIGS. 3(a) and 3(b), illustrates the write disturb reduction method implementing the modified write operation in a semiconductor memory array in embodiments of the present disclosure.

FIG. 3, which includes FIGS. 3(a) and 3(b), illustrates the write disturb reduction method implementing the modified write operation in a semiconductor memory array in embodiments of the present disclosure. Referring to FIG. 3, in some embodiments, a modified write operation 30 to a memory page selects a word line WLp in a page k (32). The page k includes a group of bit lines to be accessed together. The memory page includes memory cells on word line WLp and associated with bit lines in page k. The modified write operation 30 performs writing of memory cells to the first polarity (E) followed by writing of memory cells to the second polarity (P) (34). For example, the modified write operation 30 may write all memory cells in the memory page on word line WLp to the first polarity (E) and then write some or none of the memory cells in the memory page on word line WLp to the second polarity (P), based on the write data (34).

The modified write operation 30 then selects the next word line WLx in page k (36). For word line WLx, the modified write operation 30 performs writing of memory cells to the second polarity (P) followed by writing of memory cells to the first polarity (E) (38). For example, the modified write operation 30 may write all memory cells in the memory page on word line WLp to the second polarity (P) and then write some or none of the memory cells in the memory page on word line WLp to the first polarity (E), based on the write data (38). The modified write operation 30 then repeats to select another word line WLp in page k (32).

In this manner, each write operation to memory cells in page k is performed by flipping or switching the order of the E step and the P step so that memory cells on the bit lines in page k are not being driven persistently to the same logical state. The bit lines in page K experience a write sequence that includes a mix of E-P and P-E sequences which results in minimizing write disturb. As shown in FIG. 3(a), the modified write operation 30 results in a write sequence with alternate pairs of E-P steps and P-E steps. For example, the bit lines in page k would experience steps of E, P, P, E, etc. etc. The sequence of alternating pairs of E-P steps and P-E steps have particular advantages in reducing write disturb in memory cells on the same bit lines (in the same page), as will be explained in more detail below.

In one embodiment, the modified write operation alternate the orders of writing the first logical state step (E) (or write "1" step) and writing the second logical state step (P) (or write "0" step) for every subsequent write operation to the same group of bit lines. In other embodiments, the modified write operation select the order of the writing steps in a random fashion. That is, the order of the write "1" step and the write "0" step for each write operation is selected randomly so that in some write operations, the write "1" step (E) is performed before the write "0" step (P) and in other write operations, the write "0" step (P) is performed before the write "1" step (E). Over many write operations, the order of the E step and the P step would be randomized, as shown in FIG. 3(b). In the example shown in FIG. 3(b), the first write operation is performed with the P step followed by the E step, then the second and third write operations are performed with the E step before the P step. The result is that the bit lines in the page see a randomized switching between writing "1" and writing "0" which has the effect of reducing write disturb for memory cells in the same page of bit lines.

Figure 4:
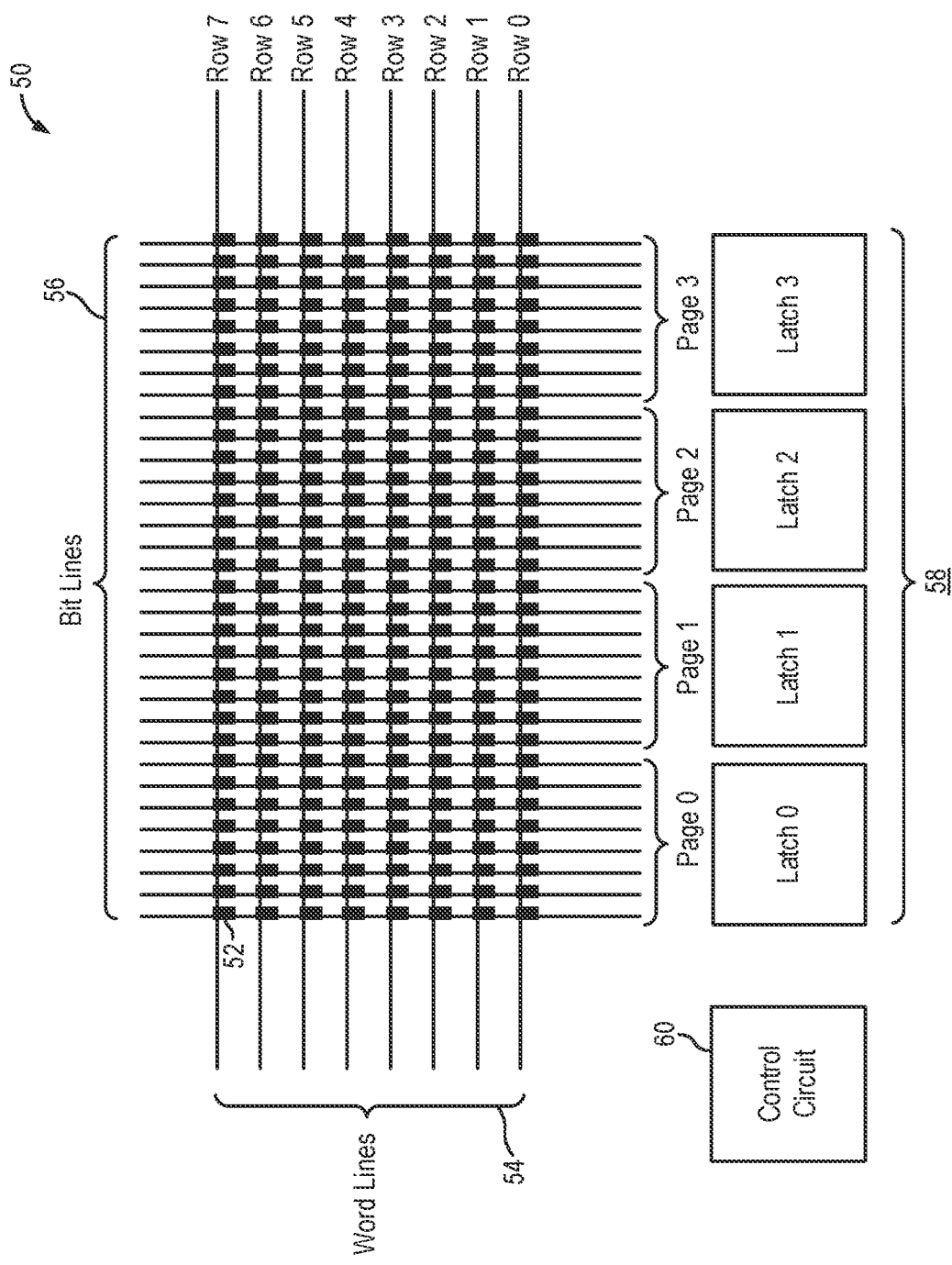
FIG. 4 illustrates a memory array implementing the write disturb reduction method in embodiments of the present disclosure.

In embodiments of the present disclosure, a semiconductor memory device implements the write disturb reduction method using registers or latches to record the order of the write operation last used. FIG. 4 illustrates a memory array implementing the write disturb reduction method in embodiments of the present disclosure. Referring to FIG. 4, a memory array 50 includes memory cells or storage transistors 52 arranged in rows and columns. Word lines 54 access rows of memory cells 52. Bit lines 56 connect to a column of memory cells 52. The memory array 50 includes a control circuit 60 for controlling the operation of the memory array. In embodiments of the present disclosure, the control circuit 60 may include address and data interface circuits, address decoders, sense amplifiers, data buffers and bit line drivers and circuitry for supporting the operation of the memory array. In the present illustrates, the bit lines 56 are grouped into pages, such as Page 0, Page 1, Page 2 and Page 3. A latch 58 is provided for each page of bit lines to store the write step order. For example, Latch 0 is provided for Page 0, Latch 1 is provided for Page 1, Latch 2 is provided for Page 2, and Latch 3 is provided for Page 3. In some embodiment, the latch 58 is a single bit latch. The latch 58 stores a data value indicating whether the last write operation to the page is performed with the write "1" step (E) first or performed with the write "0" step (P) first. By using the latches 58, the memory array 50 can keep track of the write step order for each page of bit lines and can alternate the write step order for subsequent write operations to reduce write disturb.

It is instructive to note that FIG. 4 illustrates a group of adjacently located bit lines being assigned to a page. FIG. 4 is illustrative only and not intended to be limiting. FIG. 4 can be taken as a logical representation of the memory array organized into pages. In other implementations, the bit lines assigned to a page may be selected from different locations and the bit lines are not adjacent to each other.

Figure 5:
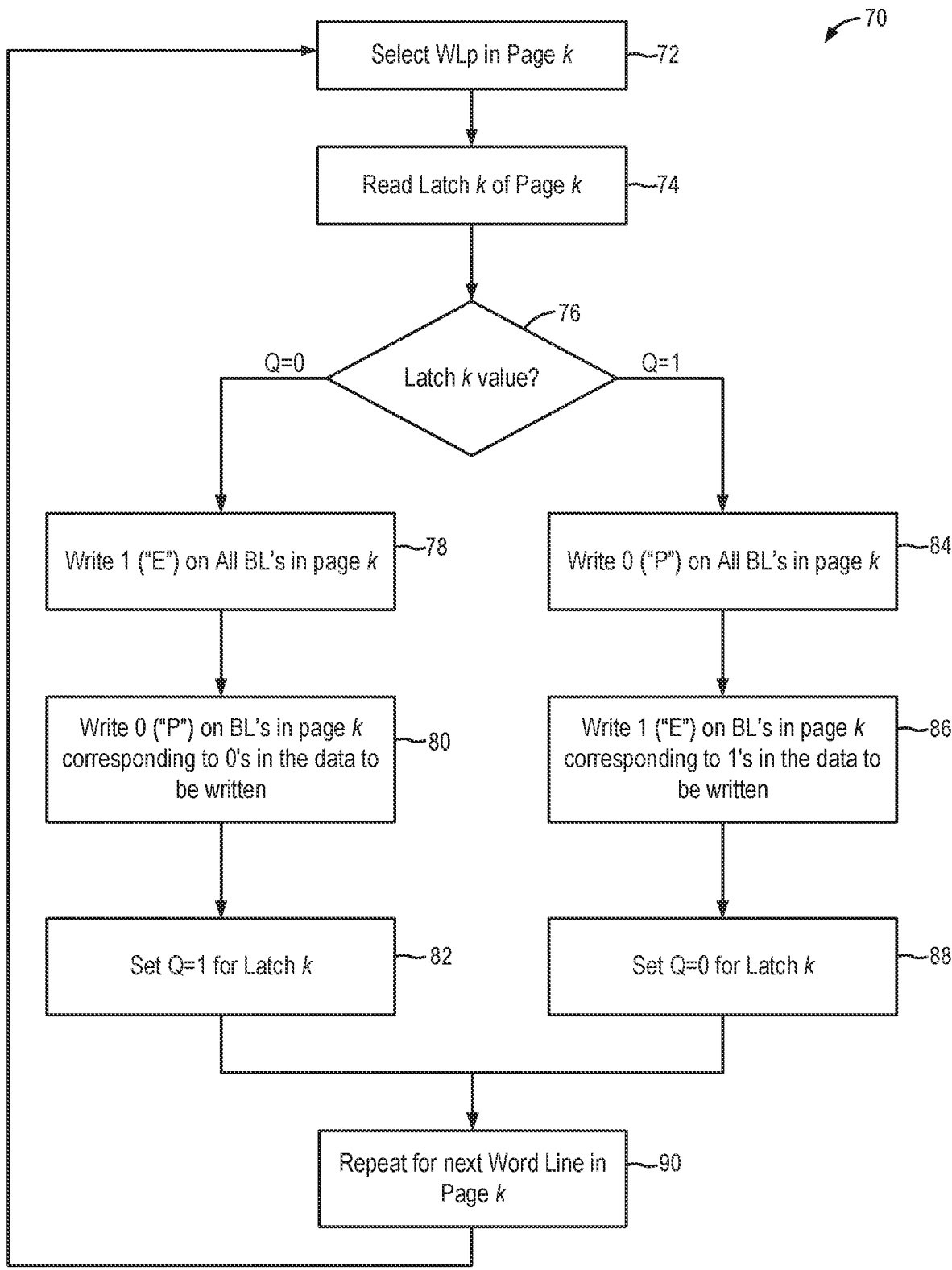
FIG. 5 is a flowchart illustrating the write disturb reduction method in embodiments of the present disclosure.

FIG. 5 is a flowchart illustrating the write disturb reduction method in embodiments of the present disclosure. Referring to FIG. 5, a write disturb reduction method 70 is implemented to perform write operations into a memory array. In particular, the write disturb reduction method 70 is applied to write data into memory cells in a page k of the memory array associated with a designated group of bit lines. The method 70 selects a word line WLp in page k to access the associated row of memory cells connected to the word line (72). The method 70 read the latch associated with page k (74). The method 70 determines the value Q stored in the latch k (76). In the event the latch value Q has a first logical state (e.g. "Q=0"), the method 70 determines the previous write operation was performed with a P step before an E step. In that case, method 70 proceeds to switch the write step order. Method 70 performs the write operation by first writing a first polarity or a first logical state ("1") on all of the bit lines in the page k (78). That is, method 70 performs the E step first. Then the method 70 writes a second polarity or a second logical state ("0") on some of the bit lines in page k corresponding to the second logical state ("0") in the data to be written (80). That is, method 70 performs the P step second. The method 70 then set the latch value Q to a second logical state (i.e. "Q=1") (82). By flipping the state or the value of the latch, after the two-step write operation, the step order of the write operation performed in page k is recorded to be used by subsequent write operations.

The method 70 then repeats the write operation for the next word line in page k (90). The method 70 returns to select the next word line in the page k (72).

In the event the latch value Q has the second logical state (e.g. "Q=1") (76), the method 70 determines the previous write operation was performed with an E step before a P step. In that case, method 70 proceeds to switch the write step order. Method 70 performs the write operation by first writing the second polarity or the second logical state ("0") on all of the bit lines in the page k (84). That is, method 70 performs the P step first. Then the method 70 writes the first polarity or the first logical state ("1") on some of the bit lines in page k corresponding to the first logical state ("1") in the data to be written (86). That is, method 70 performs the E step second. The method 70 then set the latch value Q to the first logical state (e.g. "Q=0") (88). In the manner, the step order of the write operation just performed in page k is recorded to be used by subsequent write operations.

Figure 6:
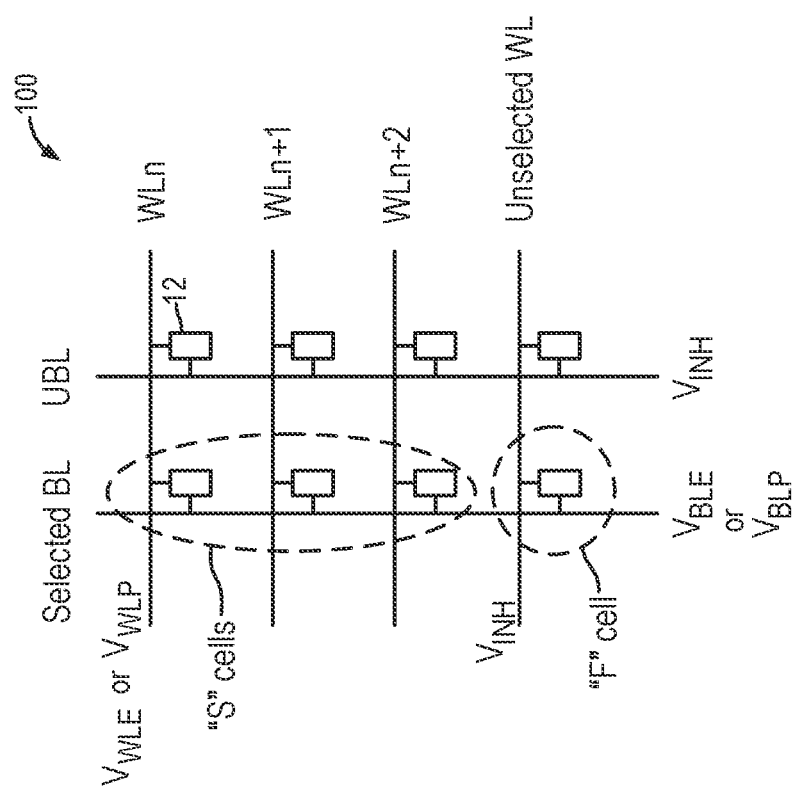
FIG. 6 is schematic diagram of a portion of a semiconductor memory array in examples of the present disclosure.

The operation of the write disturb reduction method of the present disclosure to reduce write disturb in memory cells along the bit lines will now be described. FIG. 6 is schematic diagram of a portion of a semiconductor memory array in examples of the present disclosure. Referring to FIG. 6, a portion of a memory array 100 includes memory cells arranged in a two-dimensional array and controlled by word lines WL and providing data or receiving data on bit lines BL. In the present example, data is to be written into memory cells 12 on three word lines WLn, WLn+1, and WLn+2, in succession. For a given "selected" bit line as shown, suppose the same data (e.g. logical "1") is to be written into the three bits labeled "S cells". The selected word lines will be biased to the erase or program voltage $V_{WL}$ while the selected bit line will be biased to the bit line voltage $V_{BL}$. The unselected word line and the unselected bit line will be biased to the inhibit voltage $V_{INH}$. During the write operations of the memory cells on word lines WLn, WLn+1, and WLn+2, the memory cell ("F cell") on the selected bit line but the unselected word line may suffer from write disturb, as will be explained in more detail below.

Figure 7:
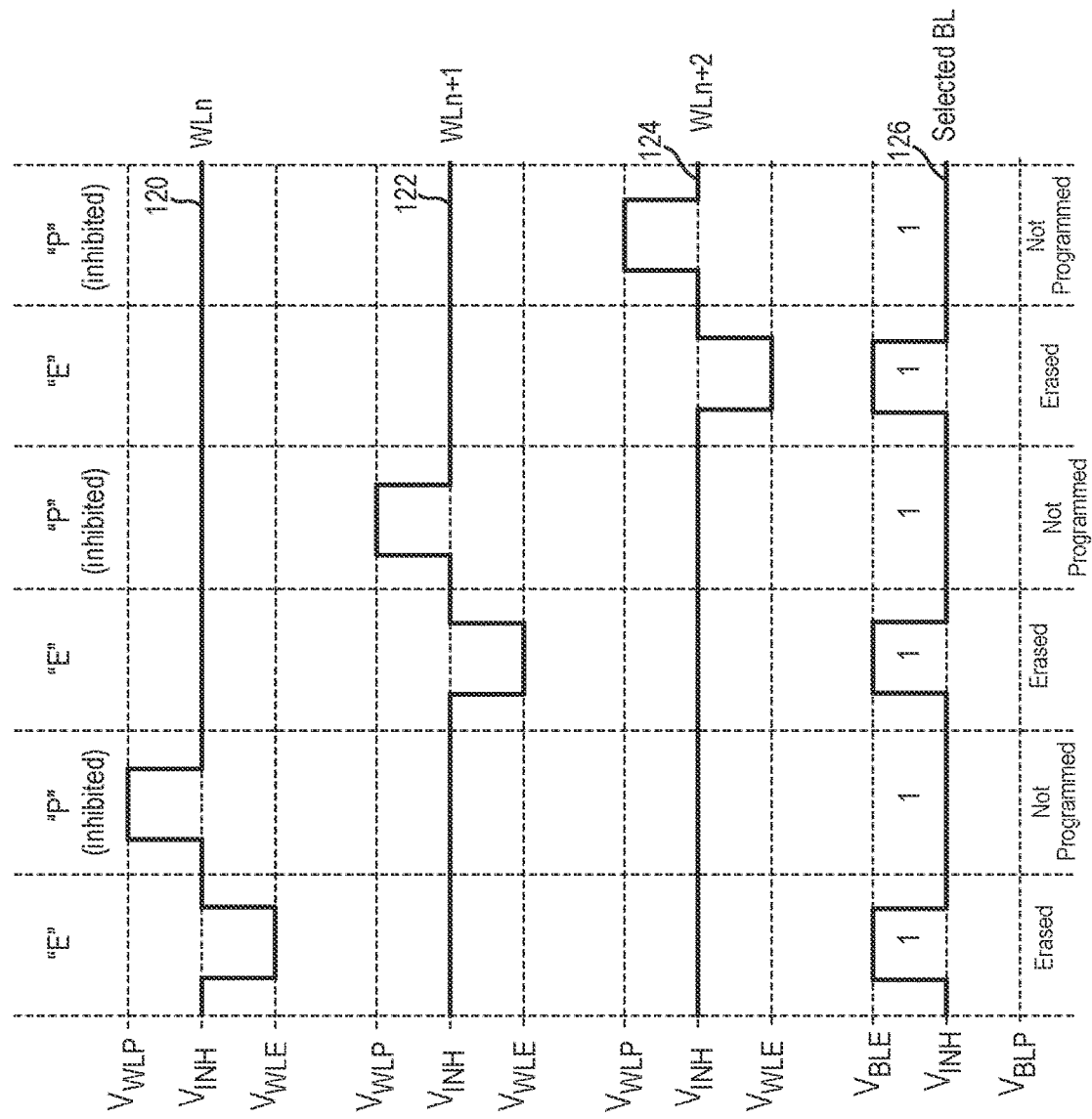
FIG. 7 is a timing diagram illustrating the write operations to the memory array of FIG. 6 in some examples.

FIG. 7 is a timing diagram illustrating the write operations to the memory array of FIG. 6 in some examples. Referring to FIG. 7, write operations are performed to write data of the first logical state ("1) to the memory cells 12 ("S cells") on word line WLn, WLn+1, WLn+2 on the same bit line. The conventional write operation performs the write steps in a given fixed order, such as the E step followed by the P step. Accordingly, each row (or each word line) has the same sequence of write steps being applied (e.g. "E-P") in succession. More specifically, to write the data logical "1" to the memory cell on word line WLn (curve 120), the word line WLn is driven first to the word line erase voltage $V_{WLE}$ with the selected bit line (curve 126) also driven to the bit line erase voltage $V_{BLE}$. In this manner, the associated memory cell is erased. The write operation than follows with the P step where the word line WLn is driven to the word line program voltage $V_{WLP}$. However, the selected bit line is kept at the inhibit voltage because the write data for this memory cell is logical "1" and the memory cell does not need to be programmed to logical "0".

Figure 8:
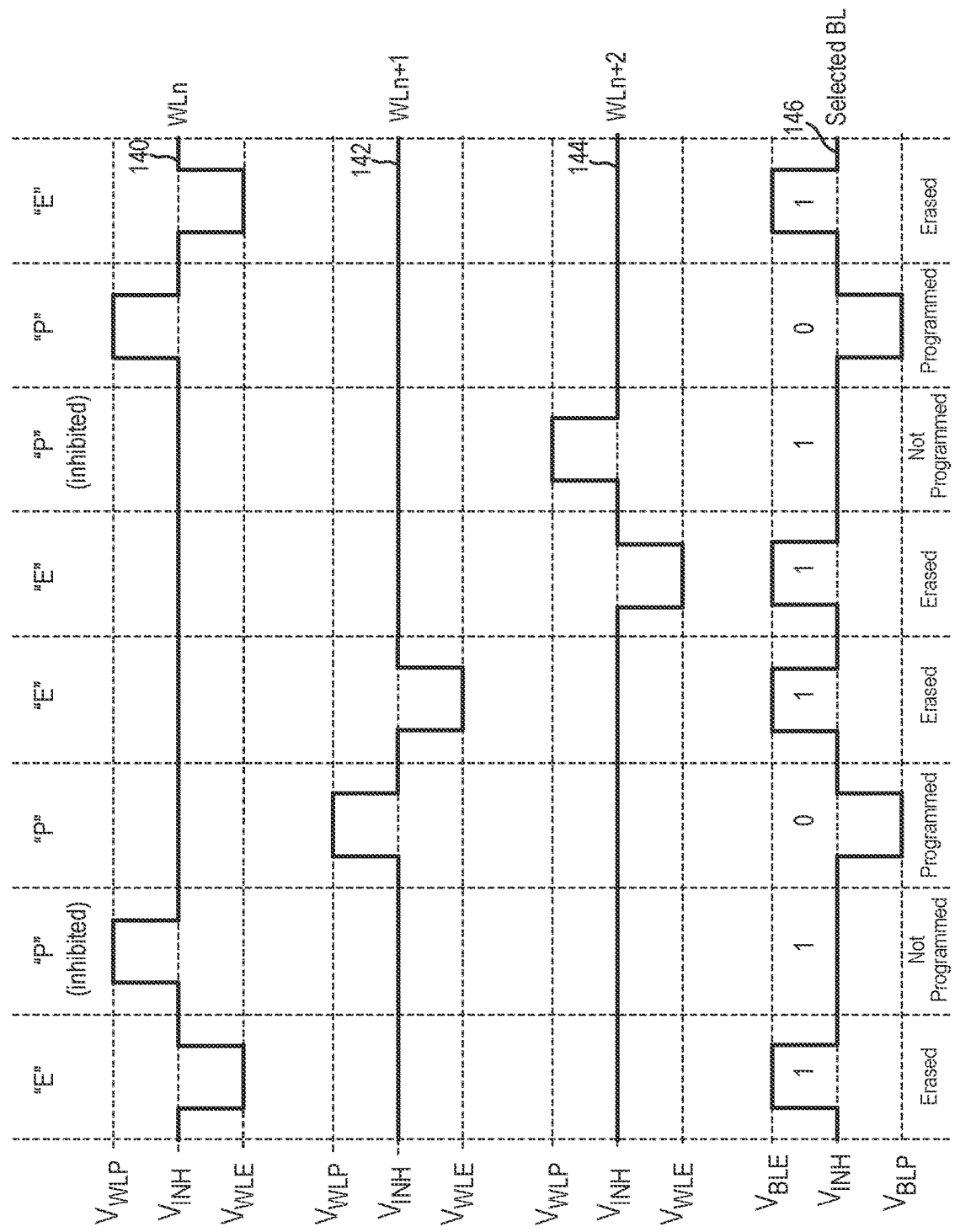
FIG. 8 is a timing diagram illustrating the modified write operations using to the write disturb reduction method as applied to the memory array of FIG. 6 in embodiments of the present disclosure.

It is instructive to note that FIG. 7 and subsequent FIG. 8 illustrate the biasing conditions for a charge-trap type storage transistors in the memory array. Accordingly, writing data of the first logical state (the "E" step) uses a negative voltage pulse on the word line relative to the bit line voltage and writing data of the second logical state (the "P" step) uses a positive voltage pulse relative to the bit line voltage. In other embodiments, the storage transistors implement ferroelectric storage mechanism. In that case, the biasing conditions have reversed voltage polarities. For instance, in the case of a ferroelectric storage transistor, writing data of the first logical state (the "E" step) uses a positive voltage pulse on the word line relative to the bit line voltage and writing data of the second logical state (the "P" step) uses a negative voltage pulse relative to the bit line voltage.

Still referring to FIG. 7, in the subsequent write operations to the memory cells on WLn+1 (curve 122) and WLn+2 (curve 124), the same sequence of write steps are applied (e.g. "E-P"). As a result, the selected bit line (curve 126) has repeated pulses from $V_{INH}$ to $V_{BLE}$ applied. For the unselected memory cell on the same bit line ("F cell" in FIG. 6), the unselected word line will be held at the inhibit voltage $V_{INH}$. However, the unselected memory cell ("F cell") will see repeated pulses of $V_{INH}$-$V_{BLE}$ across the gate-drain terminal of the unselected memory cell. If the data stored in the unselected memory cell is a logical "0," then the unselected memory cell will see repeated negative voltage pulses between the gate-to-drain terminals that tend to push the stored data toward a logical "1", without seeing any pulses that push the stored data the other way. Accordingly, the stored data value in the unselected memory cell may become disturbed. The same write disturb condition can arise when the write operation performs a write "0" step first before performing a write "1" step (e.g. "P-E"). In that case, the unselected memory cell will see repeated pulses of $V_{INH}$-$V_{BLP}$. If the data stored in the unselected memory cell is a logical "1," then the unselected memory cell will see repeated positive voltage pulses between the gate-to-drain terminals that tend to push the stored data toward a logical "0", without seeing any pulses that push the stored data the other way.

FIG. 8 is a timing diagram illustrating the modified write operations using the write disturb reduction method as applied to the memory array of FIG. 6 in embodiments of the present disclosure. Referring to FIG. 8, write operations are performed to write data of the first logical state ("1) to the memory cells 12 ("S cells") on word line WLn, WLn+1, WLn+2 on the same bit line. The modified write operation performs the write steps in alternate E-P and P-E orders. Accordingly, alternate rows of memory cells have the alternating sequence of write steps being applied in succession. The write step sequence becomes E-P-P-E over two cycles of write operations.

In particular, to write the data logical "1" to the memory cell on word line WLn (curve 140), the word line WLn is driven first to the word line erase voltage $V_{WLE}$ with the selected bit line (curve 146) also driven to the bit line erase voltage $V_{BLE}$. In this manner, the associated memory cell is erased. The write operation than follows with the P step where the word line WLn is driven to the word line program voltage $V_{WLP}$. However, the selected bit line is kept at the inhibit voltage because the write data for this memory cell is logical "1" and the memory cell does not need to be programmed to logical "0".

In the subsequent write operation to the memory cell on word line WLn+1 (curve 142), the write steps are reversed. To write the data logical "1" to the memory cell on word line WLn+1 (curve 142), the word line WLn+1 is driven first to the word line program voltage $V_{WLP}$ with the selected bit line (curve 146) driven to the bit line program voltage $V_{BLP}$. In this manner, the associated memory cell is programmed. The write operation than follows with the E step where the word line WLn is driven to the word line erase voltage $V_{WLE}$ and the selected bit line is driven to the bit line erase voltage $V_{BLE}$ to write the data for this memory cell to logical "1". The write operation continues to the memory cell on word line WLn+2 (curve 144) where the write steps are reversed again to the E-P sequence.

As a result, when the write disturb reduction method of the present disclosure is applied, for every two disturb pulses in the logical "1" direction that an "F" cell sees, a pulse in the logical "0" direction is applied. The application of the pulse in the logical "0" direction will mitigate any movement of the "F" cell towards the logical "1" state. In the case where a data logical "0" is to be written repeatedly, the write disturb reduction method of the present disclosure would produce similar results for the "F" cell disturb pulses: the ratio of logical "0" direction pulses to logical "1" direction pulses would be 2:1. This would be beneficial for "F" cells that are in the logical "1" state. The write disturb reduction method of the present disclosure ensures that a selected bit line see voltage pulses of different logical states (1 and 0) so that unselected memory cells would not be disturbed by repeated pulses in the same logical state only. The write disturb reduction method of the present disclosure represents a marked improvement over the conventional write operation with fixed write step order ("EPEPEP . . . ") where unselected memory cells may become disturb.

Figure 9:
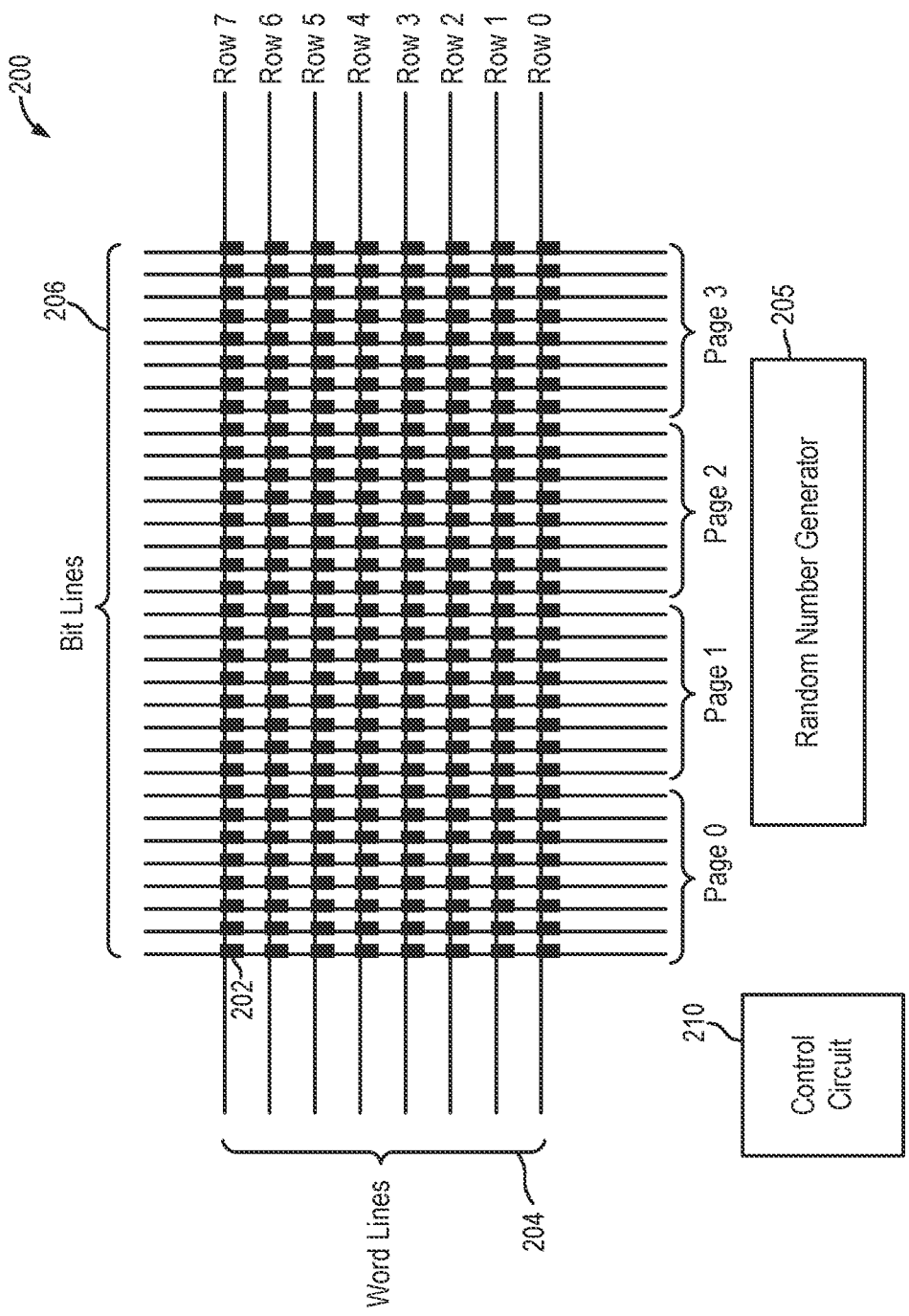
FIG. 9 illustrates a memory array implementing the write disturb reduction method in alternate embodiments of the present disclosure.

In the above described embodiments, additional latch circuits are used to store the write step order for each page of bit lines. In alternate embodiments, the write step order can be generated as a random number or pseudo-random number so that the write operations within a page are performed with write step orders that are randomly selected. FIG. 9 illustrates a memory array implementing the write disturb reduction method in alternate embodiments of the present disclosure. Referring to FIG. 9, a memory array 200 includes memory cells or storage transistors 202 arranged in rows and columns. Word lines 204 access rows of memory cells 202. Bit lines 206 connect to a column of memory cells 202. The memory array 200 includes a control circuit 210 for controlling the operation of the memory array. In embodiments of the present disclosure, the control circuit 210 may include address and data interface circuits, address decoders, sense amplifiers, data buffers and bit line drivers and circuitry for supporting the operation of the memory array.

In the present illustrates, the bit lines 206 are grouped into pages, such as Page 0, Page 1, Page 2 and Page 3. A single-bit random number generator 205 is provided to generate a data bit to indicate the write step order for the pages of bit lines in the memory array 200. More specifically, the random number generator 205 generates the data bit having a logical "1" value and a "logical 0" value in a pseudo-random manner. In one example, the random number generator 205 generates the logical "1" value to indicate a write step order of E-P, that is, writing the first logical state first and then writing the second logical state. The random number generator 205 generates the logical "0" value to indicate a write step order of P-E, that is, writing the second logical state first and then writing the first logical state. In some embodiments, the random number generator 205 is implemented using a ring oscillator-based circuit.

As thus configured, for each write operation, the random number generator 205 is read to obtain an output value to indicate to the memory array which write step order should be used for the write operation the selected memory cell. In the case the random number generator 205 generates a truly random bit (50% probability of being 1 or 0), then on average the ratio of logical "1"-direction pulses to logical "0"-direction pulses will be 2:1, for writing a stream of 1's, and vice-versa for writing a stream of 0's.

For minimal disturb, the ratio of logical "1"-direction to logical "0"-direction pulses on any disturbed cell would be 1:1. This is not possible if the same data is being written repeatedly into an array, which can happen in malicious situations. However, if the incoming data is inverted in a pseudo-random way, depending on the row address, for example, then an incoming stream of constant data to different row addresses can be converted to a more random stream. A sophisticated attacker would have to figure out the address-to-inversion logic algorithm in order to defeat it by pre-inverting the data. Implementing the address-determined-inversion method, in addition to the alternating or randomly determined P-E/E-P write step order in accordance with the present disclosure, would help shift the disturb directional ratios from 2:1 closer to 1:1. In the case where the alternating or randomly determined P-E/E-P write step order of the present disclosure is not used, but instead a fixed write step order or P-E or E-P is used, the directional ratio tends towards 2:1 only.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A method for reducing write disturb in an array of memory cells arranged in a plurality of memory pages, each memory page comprising memory cells arranged in rows and columns, the method comprising:

selecting a row of memory cells in a first memory page for a write operation to store write data into the memory cells;

determining a step order value indicative of a write step order of the write operation;

in response to the step order value having a first logical state, performing the write operation by writing data of a first logical state in all the memory cells in the selected row followed by writing data of a second logical state in at least a subset of memory cells in the selected row in response to the write data; and in response to the step order value having a second logical state, performing the write operation by writing data of the second logical state in all the memory cells in the selected row followed by writing data of the first logical state in at least a subset of memory cells in the selected row in response to the write data.

2. The method of claim 1, further comprising:

storing a step order value for each memory page, the step order value having the first logical state or the second logical state;

in response to writing data of a first logical state in all the memory cells in the selected row followed by writing data of a second logical state in the subset of memory cells, setting the step order value for the respective memory page to the second logical state; and in response to writing data of the second logical state in all the memory cells in the selected row followed by writing data of the first logical state in the subset of memory cells, setting the step order value for the respective memory page to the first logical state.

3. The method of claim 1, further comprising:

generating the step order value having the first logical state and the second logical state in a pseudo-random manner.

4. The method of claim 1, wherein writing data of the first logical state in the memory cell comprises performing an erase operation and writing data of the second logical state in the memory cell comprises performing a program operation.

5. The method of claim 4, wherein the data of the first logical state comprises data of a logical "1" value and the data of the second logical state comprises data of a logical "0" value.

6. The method of claim 4, wherein the data of the first logical state comprises data of a logical "0" value and the data of the second logical state comprises data of a logical "1" value.

7. The method of claim 1, further comprising:
selecting a next row of memory cells in the first memory page for the write operation; and
repeating the determining and the performing the write operations for the next row of memory cells.

8. The method of claim 1, wherein the memory cells arranged in a row in a memory page share a common word line and the memory cells arranged in a column in a memory page share a common bit line.

9. A method for reducing write disturb in an array of memory cells arranged in a plurality of memory pages, each memory page comprising memory cells arranged in rows and columns, the method comprising:
performing write operation on the memory cells in one of the memory pages to store write data into the memory cells, the write operation comprising a first write step of writing a data of a first logical state and a second write step of writing data of a second logical state, wherein the memory cells arranged in a row in a memory page share a common word line and the memory cells arranged in a column in a memory page share a common bit line; and
for write operation to be performed on memory cells in a selected memory page, performing the write operation for each row of memory cells by alternately performing the first write step followed by the second write step and performing the second write step followed by the first write step.

10. The method of claim 9, further comprising:
for a first selected row of memory cells in the selected memory page, performing the write operation by performing the first write step of writing data of the first logical state to all memory cells in the selected row followed by performing the second write step of writing data of the second logical state to at least some memory cells in the selected row having corresponding second logical state in the write data; and
for a second selected row of memory cells in the selected memory page, performing the write operation by performing the second write step of writing data of the second logical state to all memory cells in the selected row followed by performing the first write step of writing data of the first logical state to at least some memory cells in the selected row having corresponding first logical state in the write data.

11. The method of claim 9, further comprising:
storing a step order value for each memory page, the step order value having a first logical state or a second logical state;
determining the step order value for a selected memory page for each write operation of a selected row in the respective memory page;
in response to the step order value having the first logical state, performing the write operation of the selected row by performing the second write step followed by the first write step and setting the step order value for the respective memory page to the second logical state; and
in response to the step order value having the second logical state, performing the write operation of the selected row by performing the first write step followed by the second write step and setting the step order value for the respective memory page to the first logical state.

12. The method of claim 9, wherein performing the write operation for each row of memory cells by alternately performing the first write step followed by the second write step and performing the second write step followed by the first write step comprises:
generating a step order value having a first logical state and a second logical state in a pseudo-random manner;
obtaining the step order value for each write operation of a selected row in a selected memory page;
in response to the step order value having the first logical state, performing the write operation of the selected row by performing the second write step followed by the first write step and setting the step order value to the second logical state; and
in response to the step order value having the second logical state, performing the write operation of the selected row by performing the first write step followed by the second write step and setting the step order value to the first logical state.

13. The method of claim 9 wherein writing data of the first logical state in the memory cell comprises performing an erase operation and writing data of the second logical state in the memory cell comprises performing a program operation.

14. The method of claim 13, wherein the data of the first logical state comprises data of a logical "1" value and the data of the second logical state comprises data of a logical "0" value.

15. The method of claim 13, wherein the data of the first logical state comprises data of a logical "0" value and the data of the second logical state comprises data of a logical "1" value.

16. A memory device, comprising:
an array of memory cells arranged in a plurality of memory pages, each memory page comprising memory cells arranged in rows and columns; and
a control circuit configured to control write operations of the memory cells,
wherein the control circuit selects a row of memory cells in a first memory page for a write operation to store write data into the memory cells, the control circuit performing the write operation by:
determining a step order value indicative of a write step order of the write operation;
in response to the step order value having a first logical state, performing the write operation by writing data of a first logical state in all the memory cells in the selected row followed by writing data of a second logical state in at least a subset of memory cells in the selected row in response to the write data; and
in response to the step order value having a second logical state, performing the write operation by writing data of the second logical state in all the memory cells in the selected row followed by writing data of the first logical state in at least a subset of memory cells in the selected row in response to the write data.

17. The memory device of claim 16, further comprising:
a plurality of latch circuits, each latch circuit being associated with one of the plurality of memory pages, each latch circuit storing the step order value for the associated memory page, the step order value having the first logical state or the second logical state,
wherein in response to writing data of a first logical state in all the memory cells in the selected row followed by writing data of a second logical state in the subset of memory cells, setting the step order value for the respective memory page to the second logical state; and in response to writing data of the second logical state in all the memory cells in the selected row followed by writing data of the first logical state in the subset of memory cells, setting the step order value for the respective memory page to the first logical state.

18. The memory device of claim 16, further comprising:
a random number generator configured to generate the step order value having the first logical state and the second logical state in a pseudo-random manner.

19. The memory device of claim 16, wherein writing data of the first logical state in the memory cell comprises performing an erase operation and writing data of the second logical state in the memory cell comprises performing a program operation.

20. The memory device of claim 19, wherein the data of the first logical state comprises data of a logical "1" value and the data of the second logical state comprises data of a logical "0" value.

21. The memory device of claim 19, wherein the data of the first logical state comprises data of a logical "0" value and the data of the second logical state comprises data of a logical "1" value.

22. The memory device of claim 16, wherein the control circuit is further configured to select a next row of memory cells in the first memory page for the write operation, and to repeat the determining and the performing the write operations for the next row of memory cells.

23. The memory device of claim 16, wherein the memory cells arranged in a row in a memory page share a common word line and the memory cells arranged in a column in a memory page share a common bit line.

24. The memory device of claim 16, wherein the array of memory cells comprises an array of ferroelectric storage transistors.

\* \* \* \* \*